United States Patent
Ballenegger (10) Patent No.: US 8,373,450 B2
(45) Date of Patent: Feb. 12, 2013

(54) SYSTEM AND A METHOD FOR GENERATING AN ERROR VOLTAGE

(75) Inventor: Florian Ballenegger, Bassins (CH)

(73) Assignee: Moscad Design and Automation Sarl, Le Vaud (CH)

( * ) Notice: Subject to any disclaimer, the term of this patent is extended or adjusted under 35 U.S.C. 154(b) by 49 days.

(21) Appl. No.: 13/120,879

(22) PCT Filed: Sep. 24, 2009

(86) PCT No.: PCT/EP2009/062399
§ 371 (c)(1),
(2), (4) Date: Mar. 24, 2011

(87) PCT Pub. No.: WO2010/034782
PCT Pub. Date: Apr. 1, 2010

(65) Prior Publication Data
US 2011/0175666 A1    Jul. 21, 2011

Related U.S. Application Data

(60) Provisional application No. 61/136,708, filed on Sep. 26, 2008.

(30) Foreign Application Priority Data

Sep. 25, 2008  (EP) .................................. 08165068

(51) Int. Cl.
*G05F 1/10*  (2006.01)
(52) U.S. Cl. ....................................... 327/103; 327/337
(58) Field of Classification Search .......... 327/336–337, 327/551–559, 94, 103
See application file for complete search history.

(56) References Cited

U.S. PATENT DOCUMENTS

| 4,431,929 | A | | 2/1984 | Vittoz |
| 5,481,212 | A | * | 1/1996 | Shima .............................. 327/94 |
| 7,279,941 | B2 | * | 10/2007 | Yonezawa et al. ............ 327/101 |
| 7,535,467 | B2 | * | 5/2009 | Kim et al. ...................... 345/204 |
| 7,898,268 | B2 | * | 3/2011 | Bernardon et al. ........... 324/713 |
| 2005/0258997 | A1 | | 11/2005 | Kim et al. |
| 2006/0226892 | A1 | | 10/2006 | Moro et al. |

FOREIGN PATENT DOCUMENTS

| EP | 1 712 973 | 10/2006 |
| GB | 2 095 946 | 10/1982 |

OTHER PUBLICATIONS

International Search Report issued in PCT/EP2009/062399, mailed Dec. 18, 2009.
Written Opinion issued in PCT/EP2009/062399, mailed Dec. 18, 2009.
English language abstract of EP 1 712 973, published Oct. 18, 2006.

\* cited by examiner

*Primary Examiner* — Dinh T. Le
(74) *Attorney, Agent, or Firm* — DLA Piper LLP US (57) ABSTRACT

A precision current reference or a precision oscillator includes a circuit that precisely controls the cyclic charging of a switched capacitor. The voltage across the switched capacitor is ramped up to a desired voltage during the charge phase. The circuit comprises a network of switched capacitors around a transconductance amplifier. An error voltage between a predetermined voltage and a voltage across the switched capacitor is amplified by a transconductance amplifier to give an error current, which is integrated over time to give an integrated error voltage. The error voltage can be minimized such that the circuit produces a precise output current whose value depends on the switched capacitor capacitance, the predetermined reference voltage and a frequency used to switch the switched capacitors. Alternatively, an embodiment may be part of a frequency locked loop to provide a precise oscillator whose frequency depends on a predetermined resistance and the switched capacitor capacitance.

15 Claims, 5 Drawing Sheets

| PH # | OP | |
|---|---|---|
| PH1 | CB->CSW<br>CHGE CB/CSW | A-ZERO |
| PH2 | HLD CSW<br>SNSE NSW | |
| PH3 | RST CSW<br>SNSE VR<br>INT ERR | |

SYSTEM AND A METHOD FOR GENERATING AN ERROR VOLTAGE

The present invention relates to the domain of switched capacitor circuits and techniques and more particularly to the use of such circuits in the realisation of precision current generators and precision oscillators.

BACKGROUND OF THE INVENTION

Switched capacitor networks are widely used in the design of electronics circuits in view of their ability to simulate a resistive load in a circuit. Using a switched capacitor Csw, switched at a frequency fsw, an equivalent resistance of Req can be realised where Req=1/(fsw×Csw). It is well known that in the fabrication of semiconductor integrated circuits, absolute precision of resistance values is not easily achievable whereas absolute precision of capacitance values is well within the control of the most semiconductor fabrication processes. For this reason, the use of switched capacitor circuits in analogue semiconductor circuit design, in situations where precise resistance values are required, is of particular importance.

Precise voltage reference circuits known as "bandgap reference circuits" are today well known and widely available. An example of such a precision bandgap reference circuit is described by D. Susak in U.S. Pat. No. 5,900,773. However the generation of a precise and stable current reference is a more difficult task. The availability of precision current reference generators is necessary for achieving accuracy in applications requiring sensors (e.g. hall element biasing), data converters (e.g. current steering DAC), etc.

Such current reference circuits can be realised using a switched capacitor, a comparator, a voltage reference and a reference clock in a mixed-signal closed loop circuit as is described in US Patent Application Publication 2006/0119422A1, Semiconductor Device Including Current Control Circuit of Reference Current Source, Sakurai et al., Jun. 8, 2006. This circuit has a drawback in that it is sensitive to delay in the comparator, thus leading to significant accuracy shortcomings due to variations in fabrication process, power supply variation and temperature variations.

While an analog buffer circuit based on switched capacitors is described by Cheol-Min et al. in United States Patent Application Publication No. 2005/0258997 A1, this circuit provides a copy of an input voltage with a fixed gain of 1 whereas an amplifier capable of amplifying and integrating a differential error signal would be required to solve the problem of providing a precision current reference generator.

In European Patent Application Publication No. 1,712,973 A2, Moro et al. describe a traditional constant-gm bias current generation circuit wherein the resistive element is directly replaced by its switched capacitor equivalent network together with a buffer capacitor. The main objective of this circuit is not so much to provide a precise absolute current reference, but rather to bias analog circuits for significantly constant performance (which depends on gm/C) by adapting the bias current to process and temperature variations. This circuit suffers from a number of inaccuracies which will be described below, preventing this circuit from being useful as a high precision current reference generator.

Another important building block in analogue and mixed signal circuit design is an oscillator. Normally, in order to build an accurate oscillator, a crystal or a ceramic resonator would be used. This leads to bulky and expensive solutions which are not very flexible due to the fact that they usually have preset frequencies corresponding to the frequency of available crystals or ceramics. Using a switched capacitor network with a controllable oscillator and a divider in a closed loop configuration a very accurate and flexible oscillator can be realised. An example of such a circuit is described by T. R. Viswanathan, S. Murtuza, V. H. Syed and M. Staszel, in "Switched-Capacitor Frequency Control Loop", IEEE Journal of Solid State circuits, Vol. 17, Issue No. 4, August 1982, pp. 774-778.

Figure 1A:
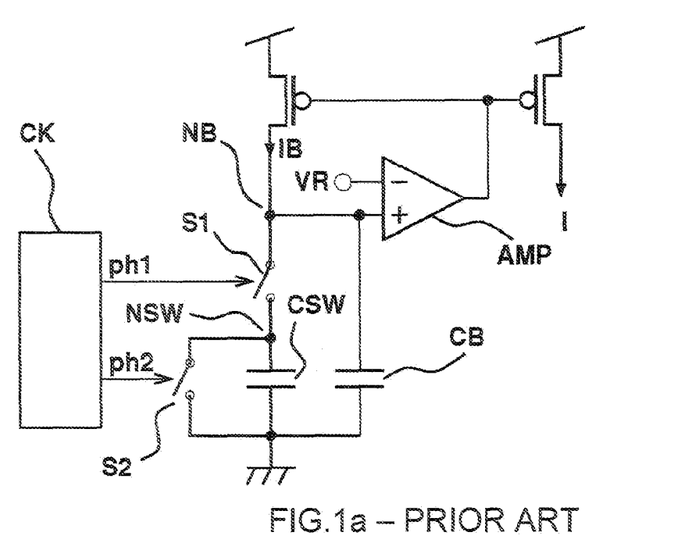
FIG. 1a is a schematic diagram of a conventional switched capacitor current generator circuit.

FIG. 1a illustrates the manner in which a switched capacitor (CSW) and an amplifier (AMP) are generally used in circuits inspired by the work of Viswanathan et al. to obtain a desired voltage across the switched capacitor (CSW), and thus the desired current flow. In this circuit, a switched capacitor (CSW) is used in a feedback circuit with an operational amplifier (AMP) configured to respond to the difference between a reference voltage (VR) and the voltage across the switched capacitor network at point NB. The difference thus detected is used to control the amount of current in the switched capacitor.

Figure 1B:
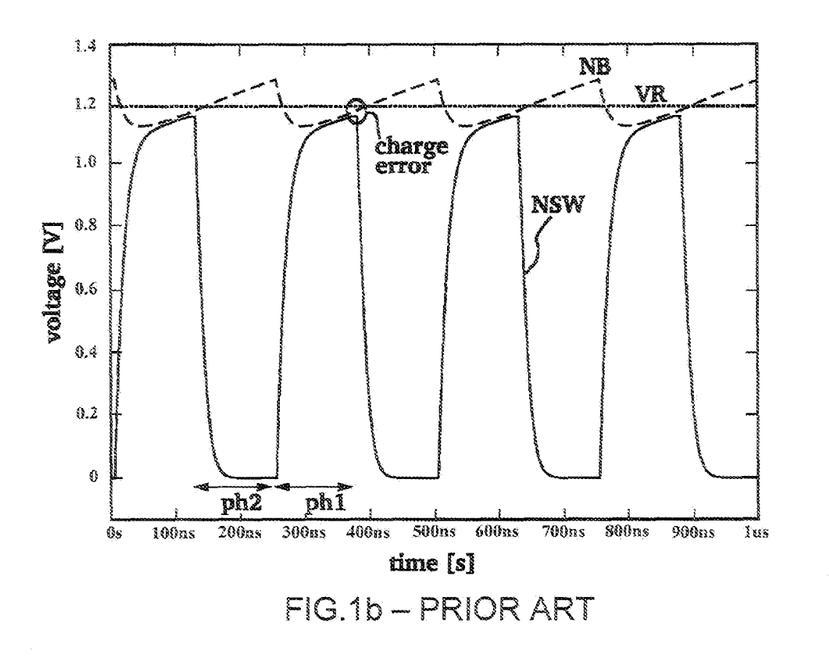

The above design suffers from some inaccuracies, which will now be described with reference to the waveform in FIG. 1b. In a first phase (ph1), the switched capacitor is connected to the operational amplifier (AMP). Since the input of the operational amplifier (NB) has a buffer capacitor (CB) connected in parallel with the switched capacitor (CSW), at the moment the switched capacitor (CSW) is connected to the operational amplifier (AMP), the voltage at the input of the operational amplifier (NB) drops due to the parallel combination of the switched capacitor (CSW) and the buffer capacitor (CB). The current source (IB) charges the capacitor pair (CSW and CB) up until the end of the first phase (ph1). In a second phase (ph2), the switched capacitor (CSW) is decoupled from the operational amplifier (AMP) and discharged. The result is that the operational amplifier input (NB) is subject to a sawtooth waveform whose slope during the first phase (ph1) is slightly less than the slope during the second phase (ph2) due to the extra capacitance from the switched capacitor (CSW) in the first phase.

It can be shown that for correct operation of the above circuit, a regulation loop including the operational amplifier (AMP) must have a bandwidth which is significantly lower than the switching frequency. Under these conditions, the loop responds approximately to the time-average of the differential voltage at the input of the amplifier. Thus the time-average voltage at node NSW is regulated through the feedback loop to be equal to the reference voltage (VR).

It is worth noting that the switched capacitor (CSW) is charged to the voltage reached at the end of the first phase (ph1), which we will refer to as Vcharge, and then discharged during the second phase (ph2). However, since the sawtooth waveform at node NSW is not perfectly symmetrical, due to the different slopes during the first and second phases, the actual time-average of the voltage at node NSW is greater than the voltage reached at the end of the first phase (ph1) by a non-zero positive amount which we will refer to as an offset voltage (Voffset). In addition, the voltage drop across the switch (S1) due to its parasitic resistance further contributes to the offset voltage (Voffset). Furthermore, any timing discrepancies between the first and second phases will lead to an unbalanced duty cycle and will yet further contribute to the offset voltage (Voffset).

The charge transferred during a period is equal to Vcharge× CSW, which corresponds to an equivalent current of I=Vcharge×CSW×fsw where fsw is the switching frequency. We have shown above that, once stabilization of the feedback loop is achieved, Vcharge is not exactly equal to the reference voltage (VR). More specifically Vcharge=VR−Voffset. Thus the equivalent current flow is I=(VR−Voffset)×CSW×fsw instead of the desired value of VR×CSW×fsw. The amount of offset (Voffset) depends on the switch and op-amp characteristics, which change with process, power supply voltage and temperature, leading to an inaccurate and unstable current flow.

One way to minimize the offset (Voffset) would be to increase the value of the buffer capacitor (CB), such the sawtooth ripple at node (NB) would be minimized. This simple solution would however consume a large chip area if the circuit were to be integrated onto a semiconductor chip. In addition, a resulting pole at node (NB) would be moved to a lower frequency, conflicting with the regulation loop's main dominant pole and leading to difficulties in achieving loop stability.

Another dynamic amplifier is described by Vittoz in U.K. Patent Application Number 2,095,946 A, This circuit is widely known and is generally well-used in the industry. However, the amplifier circuit described in the present invention is self-biasing in such a way that the output voltage in an amplification phase (cf ph1) is nominally equal to the voltage reached in a preparation phase (cf ph2), thus eliminating the residual input offset even when using low-gain devices typically available in advanced short-channel semiconductor technologies.

SUMMARY OF THE INVENTION

The present invention provides a method for generating an error voltage (Verr) across a coupling capacitor (CC) in a switching circuit device and for amplifying and integrating said error voltage (Verr), said method being used in a system comprising the switching circuit device and a clock generator (CGEN) to control the switching circuit device, said switching circuit device further comprising a reference voltage (VR), a switched capacitor (CSW), a bias current (IBB) for charging the switched capacitor (CSW), an amplifier (AMP) to receive the error voltage (Verr) via the coupling capacitor (CC) and an integrating capacitor (CINT) on which to integrate the amplified error voltage (Verr), said method characterised in that it comprises the execution of three separate phases, namely a charge phase (ph1), a hold phase (ph2) and a discharge phase (ph3), wherein:
  during the charge phase (ph1) the following steps are carried out:
    charging the switched capacitor (CSW),
    auto-zeroing the amplifier (AMP) whereby its input is made to remain at its quiescent operating point,
  during the hold phase (ph2) the following steps are carried out:
    holding the switched capacitor (CSW) at a charged voltage reached at the end of the charge phase (ph1),
    connecting the switched capacitor (CSW) to the coupling capacitor (CC),
    maintaining the auto-zeroing configuration of the amplifier (AMP),
  during the discharge phase (ph3) the following steps are carried out:
    discharging the switched capacitor (CSW),
    disconnecting the switched capacitor (CSW) from the coupling capacitor (CC) and connecting the reference voltage (VR) to the coupling capacitor (CC) thereby storing the error voltage (Verr) across the coupling capacitor (CC), said error voltage (Verr) being the difference between the reference voltage (VR) and the charged voltage,
    amplifying the error voltage (Verr) using the amplifier (AMP) and integrating the amplified error voltage onto the integrating capacitor (CINT) in order to obtain an integrated amplified error voltage (VINT),
  said three phases being cycled sequentially on a continuous basis.

The present invention further provides a system for generating an error voltage (Verr) across a coupling capacitor (CC) in a switching circuit device comprising a reference voltage (VR), a switched capacitor (CSW), a bias current (IBB), an amplifier (AMP) to receive the error voltage (Verr) via the coupling capacitor (CC), an integrating capacitor (CINT) on which to integrate the amplified error voltage, and a plurality of switches configured to allow:
  the switched capacitor (CSW) to be charged by the bias current (IBB) or held at a present charge or discharged,
  the switched capacitor (CSW) or the reference voltage to be connected to the coupling capacitor (CC),
  the amplifier (AMP) to be auto-zeroed, whereby its input is made to remain at its quiescent operating point, or to amplify the error voltage (Verr),
  and the output of the amplifier (AMP) to be connected to or disconnected from the integrating capacitor (CINT),
said system further comprising a clock generator (CGEN), said system characterised in that said clock generator is configured to control said switching circuit by cycling through three phases, namely a charge phase (ph1), a hold phase (ph2) and a discharge phase (ph3), wherein:
  during the charge phase (ph1)) the switched capacitor (CSW) is charged via the bias current (IBB) and the amplifier (AMP) is auto-zeroed whereby its input is made to remain at its quiescent operating point,
  during the hold phase (ph2) the charging of the switched capacitor (CSW) is ceased thereby holding the switched capacitor at a charged voltage, the switched capacitor (CSW) is switched to the coupling capacitor (CC) and the auto-zeroing condition of the amplifier (AMP) is maintained,
  during the discharge phase (ph3) the switched capacitor (CSW) is discharged, the reference voltage (VR) is switched onto the coupling capacitor (CC), thereby storing the error voltage (Verr) across the coupling capacitor (CC), said error voltage (Verr) being the difference between the reference voltage (VR) and the charged voltage, the error voltage (Verr) is amplified by the amplifier (AMP) and the amplified error voltage is integrated onto the integrating capacitor (CINT) to give an integrated amplified error voltage (VINT).

By using this system according to the method mentioned above, in which the clock generator is controlled by an oscillator and the reference voltage is generated by a bandgap reference voltage generator and using a feedback configuration in which the integrated amplified error voltage is used to control the bias current, a precise and stable current reference can be made.

On the other hand, if the system is used according to the method described above, where the reference voltage is generated by passing a mirrored version of the bias current through a reference resistance and where the switching circuit further comprises an output driver to convert the integrated amplified error voltage to an output current and the system further comprises a current controlled oscillator driven by the output current and a frequency divider driven by the output of the current controlled oscillator, then by driving the clock generator using the output of the frequency divider, a stable and precise crystal-less oscillator can be made.

BRIEF DESCRIPTION OF THE DRAWINGS

The following detailed description of a preferred embodiment of the present invention will best be understood when read in conjunction with the accompanying drawings, wherein:

FIG. 1b is a waveform resulting from a conventional switched capacitor current generator circuit such as that shown in FIG. 1a.

DETAILED DESCRIPTION OF A PREFERRED EMBODIMENT

The present invention involves a method for generating an error voltage across a coupling capacitor using a switching circuit device comprising the coupling capacitor, a switched capacitor, a reference voltage, an amplifier to amplify the error voltage and an integrating capacitor on which to integrate an error current resulting from the amplified error voltage. The method is carried out according to a three-phase cyclic timing regime comprising a charge phase, a hold phase and a discharge phase. The error voltage is the difference between the reference voltage and a voltage generated across the switched capacitor at the end of the charge phase during which the switched capacitor is charged via a current source. The invention also relates to a system designed to implement the above method.

By using the voltage on the integrating capacitor produced by the switching circuit device, driven according to the method of the present invention, in a feedback loop to control the current source, the invention further provides for a system comprising a clock generator driven by an oscillator to generate control signals to drive the switching circuit device according to the method above in order to minimize the error voltage thus generated. By using a precise oscillator to drive the clock generator and a bandgap generator to supply the reference voltage in the switching circuit device, the switching circuit device ideally generates an error voltage of near zero in the configuration thus described, and a stable and precise current output is generated for use as a current reference for example.

By using the voltage on the integrating capacitor produced by the switching circuit device, driven according to the method of the present invention, to control an output current source, the present invention yet further provides for a system comprising a clock generator, a current controlled oscillator to generate an output frequency dependant on the thus generated output current and a frequency divider driven by the output frequency and used in a feedback loop to drive the clock generator, to provide a precise, crystal-less oscillator.

The present invention further allows for such a reference current generator or such an oscillator to be calibrated with respect to variations in device characteristics due to process variations during the fabrication of the switching circuit device. Provision is yet further made to allow for temperature compensation to be achieved in the case that any resistors or capacitors used in the switching circuit device would have a significant variation with temperature. By nature of the use of a single-input amplifier and the switching method used, the present invention is insensitive to such effects as amplifier offset, while the effect of flicker noise in the amplifier is attenuated.

It is worth noting that by virtue of the design of the present invention, systems in which the invention is deployed will display reduced sensitivity to problems such as switch resistivity, non-symmetrical characteristics of the sawtooth ripple described above and the duty cycle of the waveform on the switched capacitor.

Figure 2:
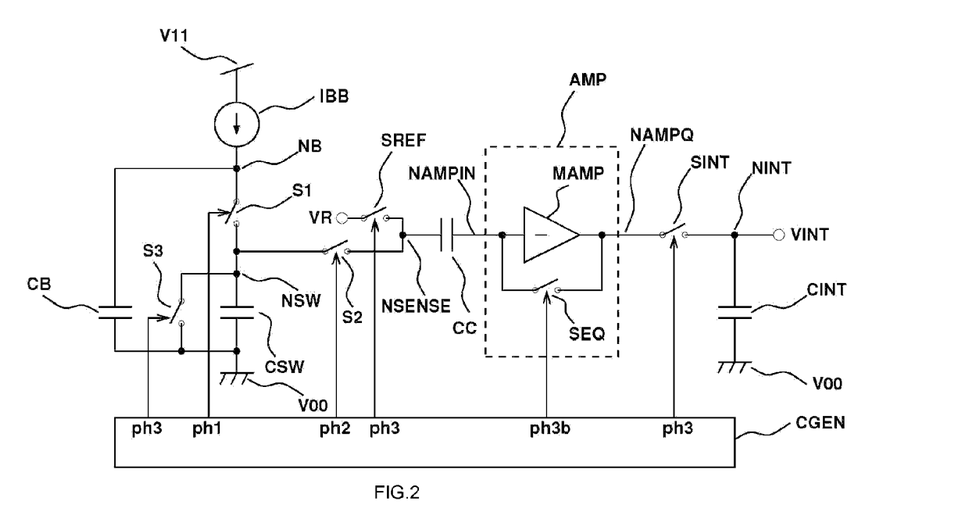
FIG. 2 is a schematic diagram of the solution proposed in the present invention.

An exemplary embodiment of the present invention is illustrated in FIG. 2. A switched capacitor (CSW) is charged by a controlled buffer bias current source (IBB) to as close as possible to a desired voltage, the desired voltage being equal to the reference voltage (VR). By appropriately controlling a set of controlled switches to connect in turn the switched capacitor voltage (NSW) then the reference voltage (VR) to a sense node (NSENSE), the difference (Verr) between the voltage on the switched capacitor at the end of its charging period and the reference voltage (VR) can be amplified (AMP) to give an error current (IERR). The error current (IERR) can be integrated over time onto an integrating capacitor (CINT) to give an integrated error voltage (VINT). The integrated error voltage (VINT) may be used as part of a feedback loop either to control the buffer bias current (IBB) which charges the switched capacitor or to control a current controlled oscillator, whose output can be used to control the switching of the switched capacitor and the associated controlled switches of the switching circuit device.

The amplifier comprises at least one amplifying element. According to an embodiment of the present invention, illustrated in FIG. 2 the amplifying element is an N-type MOSFET (NMOS) biased by a P-type MOSFET (PMOS). The input of the amplifying element is capacitively coupled to the sense node (NSENSE). The amplifier has a feedback switch (SEQ) and an output switch (SINT), both being realised as controlled switches. The controlled switches are realised as MOS transistors. A buffer capacitor (CB) is charged by the buffer bias current (IBB). The switched capacitor (CSW) is connected between a switched node (NSW) and a first common DC reference plane (V00), which in this case is ground, and the switched node can either be connected to the buffer capacitor (CB) at a buffer node (NB) and thus charged in parallel with the buffer capacitor, or it can be discharged to the first common DC reference plane (V00), or it can be isolated thus allowing the switched capacitor to hold the charge of the switched capacitor (CSW) on the switched node (NSW). A set of controlled switches (S2, SREF) is arranged whereby the sense node (NSENSE) is connected either to the reference voltage (VR) or the switched node (NSW). The entire circuit is powered by a power supply connected between the first common DC reference plane (V00) and a second common DC reference plane (V11), the voltage supplied by the power supply being higher than the reference voltage (VR).

In other embodiments of the present invention the amplifying element could be a PMOS biased by an NMOS or the output driver could comprise a current source opposite in polarity to that described in FIG. 2 and the polarity of the buffer bias could be inverted with respect to that shown in FIG. 2.

Figure 3:
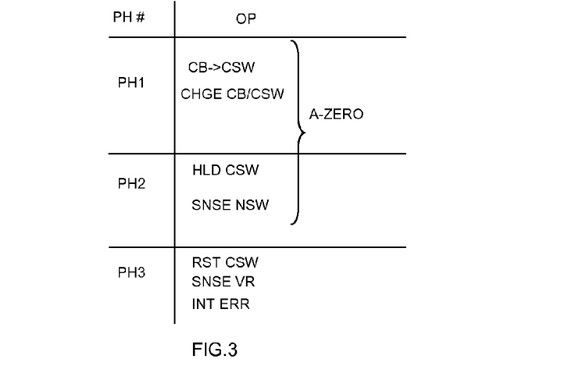
FIG. 3 shows the operations carried out during three phases according to an embodiment of the present invention.
Figure 4:
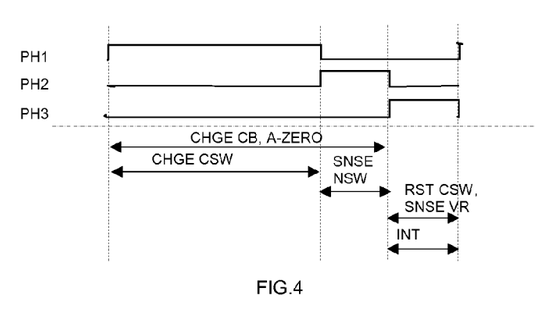
FIG. 4 shows a timing diagram of three phases and a set of operations carried out during those phases according to an embodiment of the present invention.

The switching circuit of the present invention works in three phases. According to one embodiment, in a first phase, both the switched node (NSW) and the reference voltage (VR) are disconnected from the sense node (NSENSE), while the buffer capacitor (CB) is connected in parallel with the switched capacitor (CSW) at the buffer node (NB), allowing the buffer bias current (IBB) to act upon the switched capacitor (CSW) in parallel with the buffer capacitor (CB). In a second phase, when ideally, the switched node (NSW) has reached the same potential as the reference voltage (VR), the switched capacitor (CSW) is disconnected from the buffer bias current (IBB), therefore allowing the buffer bias current (IBB) to continue to act on the buffer capacitor (CB) alone, while the switched node (NSW) is connected to the sense node (NSENSE). During both the first and second phase the output of the amplifying element (MAMP) is connected to its input i.e. the amplifier (AMP) is "auto-zeroed". A third phase then ensues, during which the switched capacitor (CSW) is reset by connecting it to a first DC reference plane, in this case V00, the reference voltage (VR) is connected to the sense node (NSENSE) (i.e. the reference voltage is "sensed"), and the output of the amplifier (AMP) is connected to the integrating capacitor (CINT) thus integrating an error current (IERR) resulting from the difference (Verr) between the reference voltage (VR) and the voltage on the switched capacitor during the second phase, onto the integrating capacitor (CINT), thus giving VINT. FIG. 3 shows a table illustrating what steps are achieved during the three phases described above. FIG. 4 shows the same information in the form of a timing diagram.

Different embodiments of the switching circuit thus described are possible. For example a PMOS transistor may be used as the amplifying element (MAMP), or the polarity of the bias currents could be inverted. Table 1 below summarises the relationships between the various operations that occur in the present invention and the phase in which they may be done for four different embodiments of the present invention. As can be seen from the table, the operations wherein the switched capacitor is charged, sensed and discharged, occur during the first phase, second phase and third phase respectively, independently of which embodiment is used. The other operation of auto-zeroing the amplifier, sensing the reference voltage and integrating the error current may be done during different phases depending on the embodiment used.

TABLE 1

| Operation | Switch | Phase 1 | Phase 2 | Phase 3 |
|---|---|---|---|---|
| Charge CSW | S1 | ON | | |
| Sense NSW | S2 | | ON | |
| Discharge CSW | S3 | | | ON |
| Embodiment 1, gm × (VR-NSW), negative | | | | |
| Auto-zero | SEQ | optional | ON | |
| Integrate | SINT | | | ON |
| Sense VR | SREF | | NA | ON |
| Embodiment 2, gm × (VR-NSW), negative | | | | |
| Auto-zero | SEQ | | ON | |
| Integrate | SINT | ON | | optional |
| Sense VR | SREF | ON | NA | optional |
| Embodiment 3, gm × (NSW-VR), positive | | | | |
| Auto-zero | SEQ | optional | | ON |
| Integrate | SINT | | ON | |
| Sense VR | SREF | optional | | ON |
| Embodiment 4, gm × (NSW-VR), positive | | | | |
| Auto-zero | SEQ | ON | | optional |
| Integrate | SINT | | ON | |
| Sense VR | SREF | ON | NA | optional |

According to a preferred embodiment of the present invention, the amplifying element (MAMP) is made from an NMOS, the switched node (NSW) is charged up towards the positive power supply and is discharged by connecting the switched node (NSW) to ground (the first common DC reference plane (V00)). The reference voltage (VR) is switched to the sense node (NSENSE) during the third phase and the error voltage (Verr) stored on the coupling capacitor (CC) as a result of switching from the switched node (NSW) to the reference voltage (VR), is amplified. The amplifier (AMP) is auto-zeroed during both the first and second phases.

Figure 5:
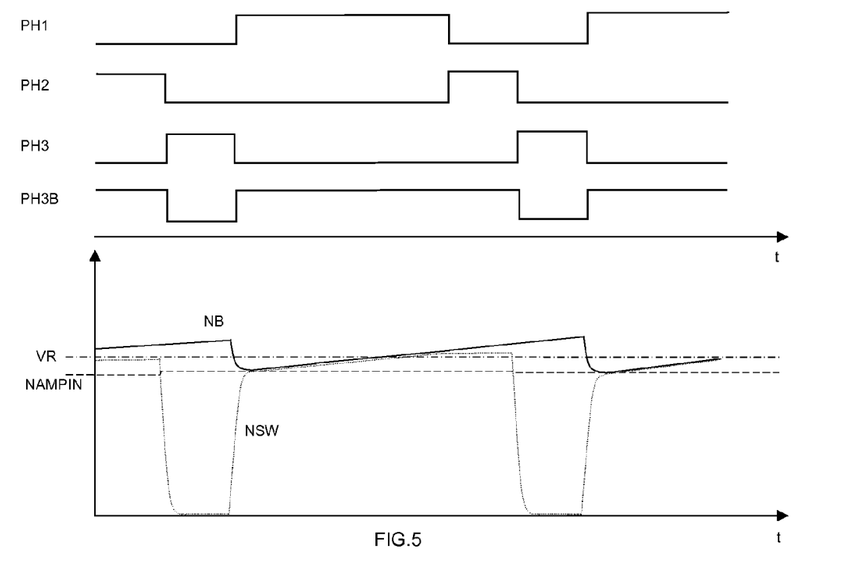
FIG. 5 is a timing diagram relative to the schematic diagram of FIG. 2.

FIG. 5 shows a timing example for the circuit in FIG. 2 in the case where the amplifying element (MAMP) is an NMOS and the first common reference DC plane (V00) is ground. The figure shows the buffer capacitor (CB) and the switched capacitor (CSW) being charged together during the first phase. The purpose of the buffer capacitor (CB) is to limit the voltage swing at the buffer node (NB). Charging of the switched capacitor (CSW) is stopped (S1) at the second phase, leaving the buffer capacitor (CB) to continue to be charged alone, at which point the voltage on the switched node (NSW) is close to the reference voltage (VR). In this example the amplifier (AMP) is auto-zeroed during the first and second phases. During this time, the voltage at the input (NAMPIN) of the auto-zeroed amplifier is determined solely by the amplifier's bias current. The establishment of the quiescent state of the amplifier thus achieved will be independent of the state of the sense node (NSENSE) since the input of the amplifier is only capacitively coupled (CC) to the sense node. In the second phase, with the amplifier still being held in auto-zero state, the switched node is connected (S2) to the sense node. At the third phase, the switched capacitor is reset by discharging it to ground (S3) and the switched node is disconnected from the sense node (S2). Furthermore, auto-zeroing of the amplifier is discontinued (SEQ), the reference voltage (VR) is connected (SREF) to the sense node and the input of the amplifier shifts by a voltage proportional to the difference between the reference voltage and the voltage at which the charging of the switched node was stopped (VNSW−VR=Verr). The difference (Verr) is amplified, and the error current, gm×Verr, where gm is the transconductance of the amplifier, is integrated onto the integrating capacitor (CINT). If there is no difference between the reference voltage (VR) and the voltage at which the charging of the switched node was stopped, then the voltage on the integrating capacitor remains constant.

Figure 6:
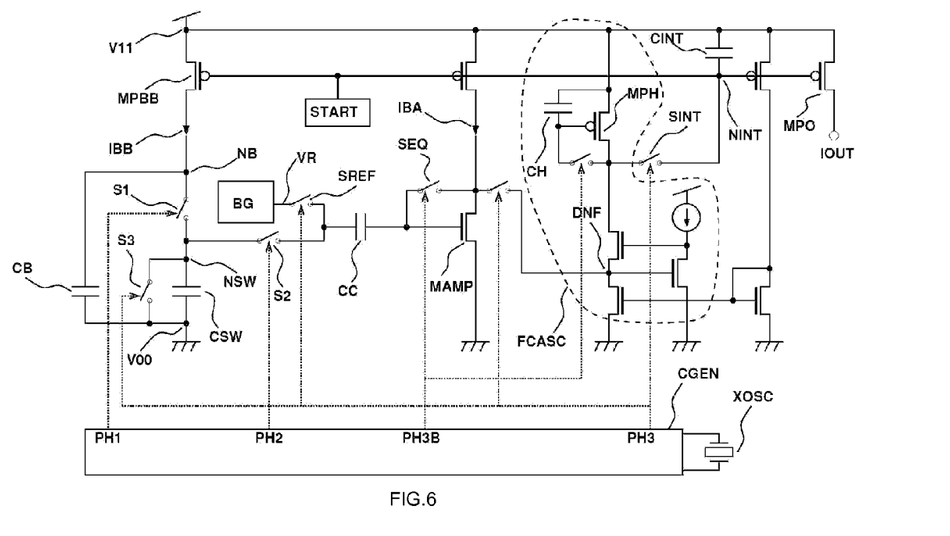
FIG. 6 is a schematic diagram of an embodiment of the present invention in a closed loop circuit, wherein said closed loop circuit is designed to provide a substantially constant and precise output current, thus overcoming certain deficiencies in the conventional circuit of FIG. 1.

FIG. 6 shows a schematic representation of an exemplary precision current reference generator within which a preferred embodiment of the present invention may be deployed. In this embodiment, a precise crystal oscillator (XOSC) operating at a frequency fSW is used to drive the clock generator (CGEN) and a precise voltage reference such as a bandgap voltage reference generator is used to provide the reference voltage (VR). An output driver is used in this embodiment to provide the output current, said output driver comprising a PMOS, therefore the integrating capacitor is coupled to the positive supply (a second common DC reference plane (V11)) to achieve better power supply rejection. The amplifier in this case further comprises a folding cascode arrangement (FCASC) of NMOS transistors so that changes in voltage at the output of the amplifying element are isolated from the integrating node (NINT), thus rendering the current output of the switching circuit less prone to power supply ripple. The folding cascode arrangement (FCASC) thus provides a convenient way to allow changes in current produced by the NMOS amplifying element to be reflected onto the PMOS side and the integrating capacitor while allowing the voltages on the gates of the PMOS's to be reached independently of the voltage at the output of the amplifier. The folding cascode stage (FCASC) is encircled in FIG. 6. During the first and second phases, while the amplifier is in auto-zero mode, a holding capacitor (CH) stores the voltage corresponding to the quiescent state of the folding cascode stage (FCASC). During the third phase, when the amplifying element gives a change in current due to the voltage difference between the reference voltage and the voltage on the switched capacitor, the gate of MPH is maintained by the holding capacitor (CH) and the drain is connected to the integrating capacitor (CINT). The change in current provided by the amplifying element is reflected and integrated onto ONT. Since the integrating node (NINT) is isolated from the amplifier output thanks to the folding cascode arrangement (FCASC), the voltage change at the integrating node (NINT) is independent of the voltage change at the amplifier output. The output current is generated by applying the voltage at the integrating node to the gate of a PMOS (MPO), The current thus achieved can be mirrored via PMOS devices, to be used both to bias the amplifying element and to provide the bias current for the buffer capacitor, thus closing the feedback loop to provide a precise and stable current reference determined by CSW× VR×fSW×N. where N is the ratio of the width of the output PMOS (MPG) to the width of the PMOS current source on the switched capacitor (MPBB), given that they have the same length.

In order to guarantee the precision of the current reference generator thus described, there has to be extremely good matching between the sizes and characteristics of the PMOS devices MPO and MPBB. One of the consequences of this is that these two transistors need to be very large. The fact that these transistors are large means that most of the capacitance value of the integrating capacitor (CINT) is made up of the parasitic capacitance of the gates of MPO and MPBB.

As well as the desired mode of operation described above, the switching circuit in FIG. 6 also has a stable mode of operation wherein the current at the output (IOUT) is zero and the bias current in the amplifier (IBA) as well as the bias current (IBB) for the buffer capacitor are zero. To avoid the circuit entering this useless mode, a startup circuit is included whereby when the circuit is initially powered up, the voltage on the integrating node (NINT) is temporarily pulled down in order to make sure that current starts to flow and that circuit starts up and reaches the desired mode of operation.

Figure 7:
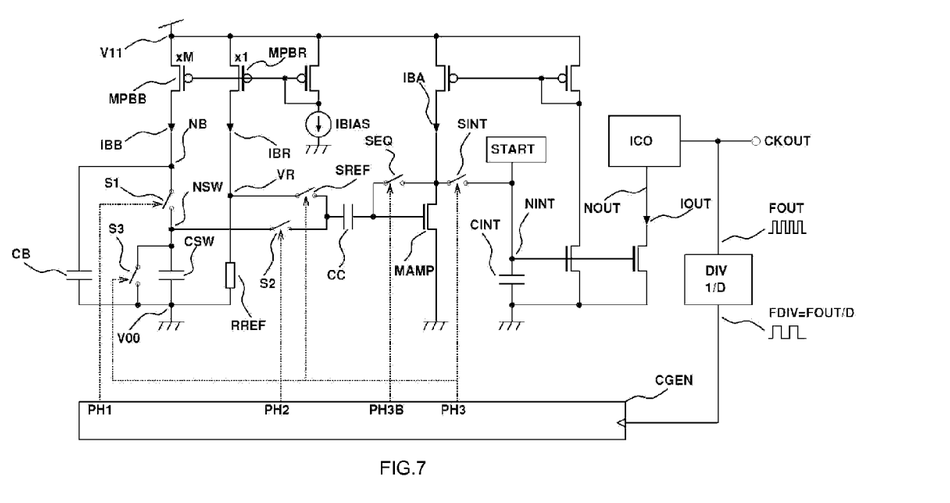
FIG. 7 is a schematic diagram of an embodiment of the present invention in a closed loop circuit, wherein said closed loop circuit is designed to provide a substantially constant and precise output clock.

FIG. 7 shows another circuit within which a preferred embodiment of the present invention may be deployed. In this circuit the integrated error voltage (VINT) is converted to a current by a driver circuit to drive a controlled oscillator thus giving an output clock (CKOUT) of frequency (FOUT). The frequency (FOUT) of the output clock (CKOUT) may be divided down (DIV) and the signal thus produced (FDIV) used to drive the clock generator (CGEN) to provide the signals to control the switching of the switched capacitor (CSW) and the other controlled switches defining the three phases described above. The output current from the driver circuit (IOUT) is also mirrored back to be used to bias the amplifying element (MAMP), thus making sure that the input of the amplifier (NAMPIN) is always at its optimum voltage. In this embodiment, the reference voltage (VR), which need not be precise, is generated by forcing a reference bias current (IBR) through a reference resistor (RREF). The reference bias current (IBR) can be generated by mirroring a bias current source (IBIAS). The same bias current source (IBIAS) can be mirrored to be used as a buffer bias current (IBB). The embodiment thus described forms a very effective frequency locked loop and can be used as a precision crystal-less oscillator whose output frequency at CKOUT is determined by D×M/(RREF×CSW), where D is the ratio by which the divider reduces the frequency of the output clock and M is the ratio of the width of the PMOS current source (MPBB) on the switched capacitor (CSW) to the width of the PMOS current source (MPBR) on the reference resistor (RREF), given that they have the same length.

As well as the desired mode of operation described above, the switching circuit in FIG. 7 also has a stable mode of operation wherein the current at IOUT is zero and therefore there is no clock signal at CKOUT. To avoid the circuit entering this useless mode, a startup circuit is included whereby when the circuit is initially powered up, a small current is temporarily injected into the integrating node (NINT) in order to start the controlled oscillator and to start up the amplifier and so make sure that current starts to flow and that the circuit starts up and reaches the desired mode of operation.

It is well known that in the fabrication of semiconductor integrated circuits, absolute precision of resistance values is not easily achievable. Therefore, in the case that the circuit described above is fabricated on a semiconductor integrated circuit, provision is made to compensate for the effects of variations in the value of the on-chip resistances on the circuit's performance. This provision is made either by intervening on the value of the reference resistor (RREF) or by intervening on the value of the reference bias current (IBR) or by intervening on the value of the buffer bias current (IBB) or by intervening on the value of the switched capacitor (CSW) or by a combination of any of these interventions.

Figure 8:
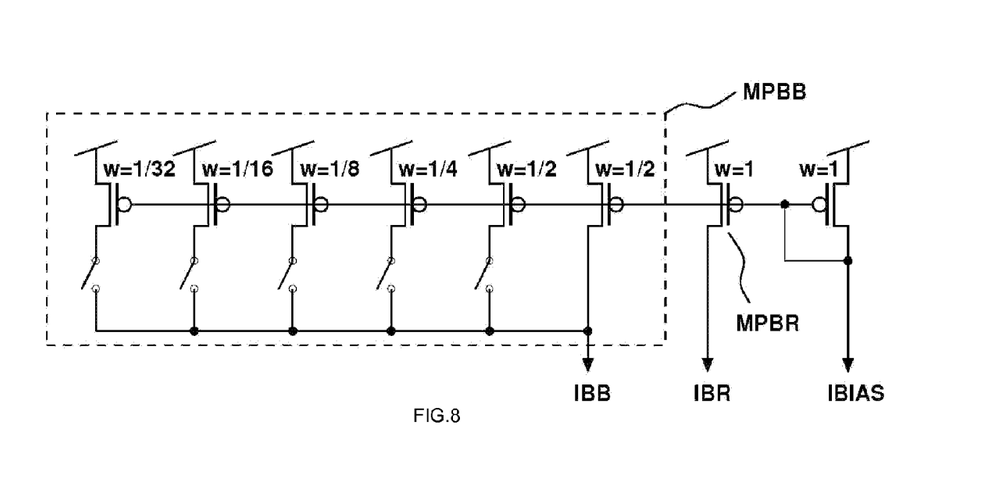
FIG. 8 shows a method using programmable switches to modify the current in one branch of a group of transistor branches arranged in a current mirror topology, used to compensate for variations in operating characteristics of the switching circuit device due to variations caused by the manufacturing process.

To allow for an intervention on the value of reference resistor (RREF), said resistor is built from a number of sections of resistances which can be combined in an adequate manner, using programmable switches, to give a desired final resistance for each individual circuit. To intervene on the buffer bias current (IBB), the ratio of the current in the reference resistor to the buffer bias current (IBB), which is used to charge the switched capacitor (CSW), can be modified by building at least one of the transistors involved in the current mirror configuration relating these currents, from a number of parallel sections of transistor, each of which can be included or excluded from the mirror using programmable switches. It could be arranged for the parallel sections of transistor to be of varying widths so that the granularity of the addition/exclusion of sections of transistor could be optimised (FIG.

8). To allow for an intervention on the value of the switched capacitor (CSW), said capacitor is built in a number of sections which can be combined in an adequate manner using programmable switches to give the total final capacitance.

Figure 9:
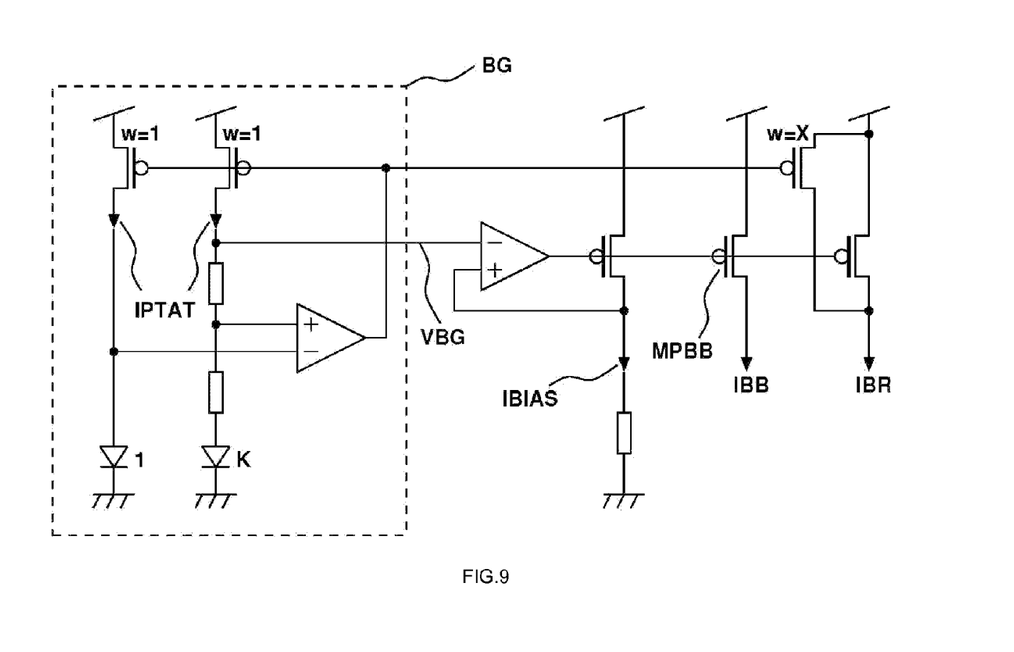
FIG. 9 shows a schematic of a solution used in the switching circuit device for compensating for variations in operating characteristics due to variations in temperature.

Any of the circuits described above may be sensitive to temperature changes. This is the case for example in the embodiment described in FIG. 7 since the reference resistance (RREF) will vary with temperature. In fact the value of the reference voltage is proportional to absolute temperature and can be described as IBIAS×RREF0(1+TCR×T), where TCR is the temperature coefficient of RREF, T is the absolute temperature and RREF0 is the value of RREF at 0K. This means that, assuming that TCR has a negative value, the reference voltage will decrease as the temperature rises. Compensation must be made therefore by increasing the reference bias current as the temperature increases. On the other hand, a bandgap voltage reference circuit generally comprises a current generator, the current from which (IPTAT) is defined by design and is proportional to absolute temperature. It is sufficient therefore to reflect part of the current from the bandgap generator and add it to the reference bias mirror using a temperature compensation current mirror. The amount of current to be mirrored is given by the relationship X×IPTAT/T=IBIAS×TCR where X is the ratio of sizes of transistors used in the temperature compensating current mirror. An example of a circuit with temperature compensation is shown in FIG. 9. In practice it turns out that the compensation current is generally a small fraction of the current in the bandgap generator, therefore X<<1.

This same technique described above can be used to compensate for variations in the value of the capacitance (CSW) with temperature. The total amount of current mirrored from the bandgap generator to be added to the buffer bias current is then given by X×IPTAT/T=IBIAS×(TCR+TCC) where TCC is the temperature coefficient of the switched capacitor (CSW).

The present invention therefore aims to remedy the problems encountered mentioned above in the prior art by first charging the switched capacitor to a value close to the reference voltage, holding said voltage and then connecting the switched capacitor to the amplifier. The present invention does not aim to regulate the time-average voltage at the buffer node (NB), but instead directly regulates the charge on the switched capacitor represented by the voltage of node (NSW) at the end of the charging phase. A three-phase method is used to achieve this goal, wherein, in an exemplary embodiment, one phase is used to charge the switched capacitor, one phase is used to sense the voltage on the switched capacitor and one phase is used for amplifying the error voltage while the reference voltage is being sensed and the voltage across (NSW) is held constant. The amplifier design is also specifically designed in order to work synchronously to the new switched capacitor three-phase control timing regime and to minimise errors due to the amplifier itself.

The problem experienced in the state of the art due to the saw-tooth waveform on the switched capacitor is therefore no longer relevant in the present invention since only the voltage at the end of the charging period is taken into consideration. Circuits in the prior art generally do a time-average of the switched capacitor voltage, whereas the switched capacitor in the present invention also functions as a hold device in a sample-and-hold configuration used in the present invention. Furthermore, the present invention uses a single-input amplifier with a coupling capacitor to hold the error voltage (Verr), thus eliminating offset errors associated with differential input amplifiers.

It is worth noting that once in equilibrium, the systems based on the techniques described in the present invention exhibit the feature that no current is drawn from the reference voltage source (VR), thus allowing for a high impedance reference voltage source to be used directly, without requiring the use of an interface buffer.

Using this building block in different embodiments of the present invention, it is thus shown how to design either a precision constant current reference circuit based on a capacitance, a voltage value and a switching frequency or a precision frequency generator or a precision oscillator based on a resistance and a capacitance.

The invention claimed is:

1. A method for generating an error voltage across a coupling capacitor in a switching circuit device and for amplifying and integrating said error voltage, said method being used in a system comprising the switching circuit device and a clock generator to control the switching circuit device, said switching circuit device further comprising a reference voltage terminal connectable to a reference voltage, a switched capacitor, a bias current terminal connectable to a bias current for charging the switched capacitor, an amplifier to receive the error voltage via the coupling capacitor and an integrating capacitor on which to integrate the amplified error voltage, said method comprising:
   executing a charge phase comprising the steps:
      charging the switched capacitor;
      auto-zeroing the amplifier whereby its input is allowed to establish a quiescent operating voltage corresponding to a quiescent operating point of the amplifier;
   executing a hold phase at an end of the charge phase the hold phase comprising the steps:
      holding the switched capacitor at a charged voltage reached at the end of the charge phase;
      connecting the switched capacitor to the coupling capacitor;
      maintaining the auto-zeroing configuration of the amplifier;
   executing a discharge phase comprising the steps:
      discharging the switched capacitor;
      disconnecting the switched capacitor from the coupling capacitor and connecting the reference voltage to the coupling capacitor thereby storing the error voltage across the coupling capacitor, said error voltage being the difference between the reference voltage and the charged voltage;
      amplifying the error voltage using the amplifier and integrating the amplified error voltage onto the integrating capacitor in order to obtain an integrated amplified error voltage;
   wherein the charge, hold and discharge phases are cycled sequentially on a continuous basis.

2. The method according to claim 1, wherein said system further comprises an oscillator to drive the clock generator, said method further comprising the following steps:
   controlling the bias current using the integrated amplified error voltage.

3. The method according to claim 1, wherein said switching circuit further comprises a reference resistor and said system further comprises a controlled oscillator and a frequency divider arranged to provide an input to the clock generator, said method comprising the following steps:
   forcing a reference bias current through the reference resistor in order to generate the reference voltage;
   driving the controlled oscillator using the integrated amplified error voltage to give an output clock;

dividing the output clock by at least one, using the frequency divider; and driving the clock generator using the divided output clock.

4. A system for generating an error voltage across a coupling capacitor in a switching circuit device comprising:
a reference voltage terminal connectable to a reference voltage, a switched capacitor, a bias current terminal connectable to a bias current, an amplifier to receive the error voltage via the coupling capacitor, an integrating capacitor on which to integrate the amplified error voltage, and a plurality of switches
the switches being configured to allow:
the switched capacitor to be charged by the bias current, held at a present charge, or discharged;
the switched capacitor or the reference voltage to be connected to the coupling capacitor;
the amplifier to be auto-zeroed, whereby its input is allowed to establish a quiescent operating voltage corresponding to a quiescent operating point of the amplifier, or to amplify the error voltage; and
the output of the amplifier to be connected to or disconnected from the integrating capacitor; and
a clock generator;
wherein said clock generator is configured to control said switching circuit by cycling through a charge phase, a hold phase and a discharge phase, wherein:
during the charge phase the switched capacitor is charged via the bias current and the amplifier is auto-zeroed whereby its input is made to remain at its quiescent operating point;
during the hold phase the charging of the switched capacitor is ceased thereby holding the switched capacitor at a charged voltage, the switched capacitor is switched to the coupling capacitor and the auto-zeroing condition of the amplifier is maintained; and
during the discharge phase the switched capacitor is discharged, the reference voltage is switched onto the coupling capacitor, thereby storing the error voltage across the coupling capacitor, said error voltage being the difference between the reference voltage and the charged voltage, the error voltage is amplified by the amplifier and the amplified error voltage is integrated onto the integrating capacitor to give an integrated amplified error voltage.

5. The system according to claim 4, wherein the switching circuit further comprises a buffer capacitor biased by the bias current in a continuous manner.

6. The system according to claim 4, wherein said amplifier comprises an amplifying element, said amplifying element being an N-type MOS transistor biased by an amplifier bias current, said auto-zeroing being achieved by connecting the output of the amplifier to its input.

7. The system according to claim 4, wherein said switching circuit device further comprises an output driver to convert the integrated amplified error voltage to an output current, a bandgap reference voltage generator to generate said reference voltage and an oscillator to drive the clock generator, said output current being used in a current-mirror configuration to control the bias current and the amplifier bias current.

8. The system according to claim 4, wherein the switching circuit device further comprises a folding cascode stage connected between the amplifier output and the integrating capacitor to reduce the sensitivity of the output current to power supply ripple.

9. The system according to claim 4, wherein the reference voltage is generated by forcing a reference bias current through a reference resistance, said reference bias current being related to the bias current through a current mirror configuration, and wherein said switching circuit device further comprises an output driver to convert the integrated amplified error voltage to an output current and to generate the amplifier bias current proportional to the output current using a current mirror configuration, said system further comprising a current controlled oscillator and a clock divider, said current controlled oscillator being driven by the output current to give an output clock, said feedback configuration comprising the use of the clock divider output to control the clock generator.

10. The system according to claim 4, wherein said switching circuit further comprises a startup circuit to ensure that said output current is nonzero by injecting a startup current onto the integrating capacitor.

11. The system according to claim 4, wherein at least one of the capacitors in the switching circuit is at least partially made from a parasitic capacitance.

12. The system according to claim 4, wherein said switching circuit device comprises a system for compensating for variations in resistivity of the reference resistance, said compensating system comprising at least one of the following provisions:
the reference resistance comprises a plurality of resistive sections each associated with at least one programmable switch to allow said resistive section to participate in or to be excluded from the overall resistance of said reference resistance;
the switched capacitor comprises a plurality of capacitive sections each associated with at least one programmable switch to allow said capacitive section to participate in or to be excluded from the overall capacitance of said switched capacitor; and
at least one branch of any of the current mirror configurations comprises at least one transistor and a plurality of parallel sections of transistor, each of said sections of transistor being connected via a programmable switch to said branch to allow said section to be included in or to be excluded from said branch.

13. The system according to claim 4, wherein said switching circuit device further comprises a system for compensating for variations in the value of the reference resistance and/or for variations in the value of the switched capacitor due to variations in temperature, said system comprising a temperature compensation current mirror to reflect a proportion of a current whose value is proportional to temperature, said proportion of current being used to adjust either the bias current or the reference bias current.

14. The system according to claim 4, further comprising a bias current generator connected to the circuit terminal.

15. The system according to claim 4, further comprising a voltage source connected to the reference voltage terminal.

* * * * *